United States Patent
Ashjaee et al.

(10) Patent No.: US 12,362,770 B2
(45) Date of Patent: Jul. 15, 2025

(54) LOAD BALANCED DECODER SYSTEMS AND METHODS

(71) Applicant: Intel Corporation, Santa Clara, CA (US)

(72) Inventors: Spanta Ashjaee, San Jose, CA (US); Gee Hang Lui, San Jose, CA (US); Jiun-Yee Lin, San Jose, CA (US)

(73) Assignee: Altera Corporation, San Jose, CA (US)

( * ) Notice: Subject to any disclaimer, the term of this patent is extended or adjusted under 35 U.S.C. 154(b) by 629 days.

(21) Appl. No.: 17/680,062

(22) Filed: Feb. 24, 2022

(65) Prior Publication Data

US 2022/0182076 A1    Jun. 9, 2022

(51) Int. Cl.
H03M 13/37    (2006.01)
H03M 13/11    (2006.01)

(52) U.S. Cl.
CPC ...... *H03M 13/3707* (2013.01); *H03M 13/116* (2013.01)

(58) Field of Classification Search
CPC .................................................. H03M 13/3707
See application file for complete search history.

(56) References Cited

U.S. PATENT DOCUMENTS 10,581,457 B2    3/2020    Chiu et al.

FOREIGN PATENT DOCUMENTS

CN    115408137 A    * 11/2022    ......... G06F 12/0842
CN    119030665 A    * 11/2024    ........... H04L 1/0045

OTHER PUBLICATIONS

C. Tarver, M. Tonnemacher, H. Chen, J. Zhang and J. R. Cavallaro, "GPU-Based, LDPC Decoding for 5G and Beyond," in IEEE Open Journal of Circuits and Systems, vol. 2, pp. 278-290, 2021, doi: 10.1109/OJCAS.2020.3042448. (Year: 2020).*
"5G LDPC-V Intel® FPGA IP User Guide," Intel Corporation, Aug. 19, 2020, pp. 1-29.

* cited by examiner

*Primary Examiner* — Joseph D Torres
(74) *Attorney, Agent, or Firm* — InventIQ Legal LLP; Steven J. Cahill

(57) ABSTRACT

A decoding circuit system includes a load balancing scheduler circuit, a full range decoder circuit, and an auxiliary decoder circuit. The load balancing scheduler circuit provides codewords that each have a lifting factor greater than a predefined value to the full range decoder circuit. The full range decoder circuit decodes the codewords that each have a lifting factor greater than the predefined value to generate first decoded output data. The load balancing scheduler circuit provides codewords that each have a lifting factor less than the predefined value to the auxiliary decoder circuit. The auxiliary decoder circuit decodes the codewords that each have a lifting factor less than the predefined value to generate second decoded output data.

20 Claims, 3 Drawing Sheets

LOAD BALANCED DECODER SYSTEMS AND METHODS

FIELD OF THE DISCLOSURE

The present disclosure relates to electronic circuits, and more particularly, to load balanced decoder systems and methods.

BACKGROUND 5G is the fifth generation communication standard for broadband mobile networks. 5G NR (new radio) is a radio access technology developed by the 3rd Generation Partnership Project (3GPP) for 5G (fifth generation) mobile networks. Low-density parity-check (LDPC) codes are linear error correcting codes that can be used to correct errors in data transmitted over communications channels. LDPC codes are used to correct errors in the data channels used in 5G new radio (NR) networks.

DETAILED DESCRIPTION

Figure 1:
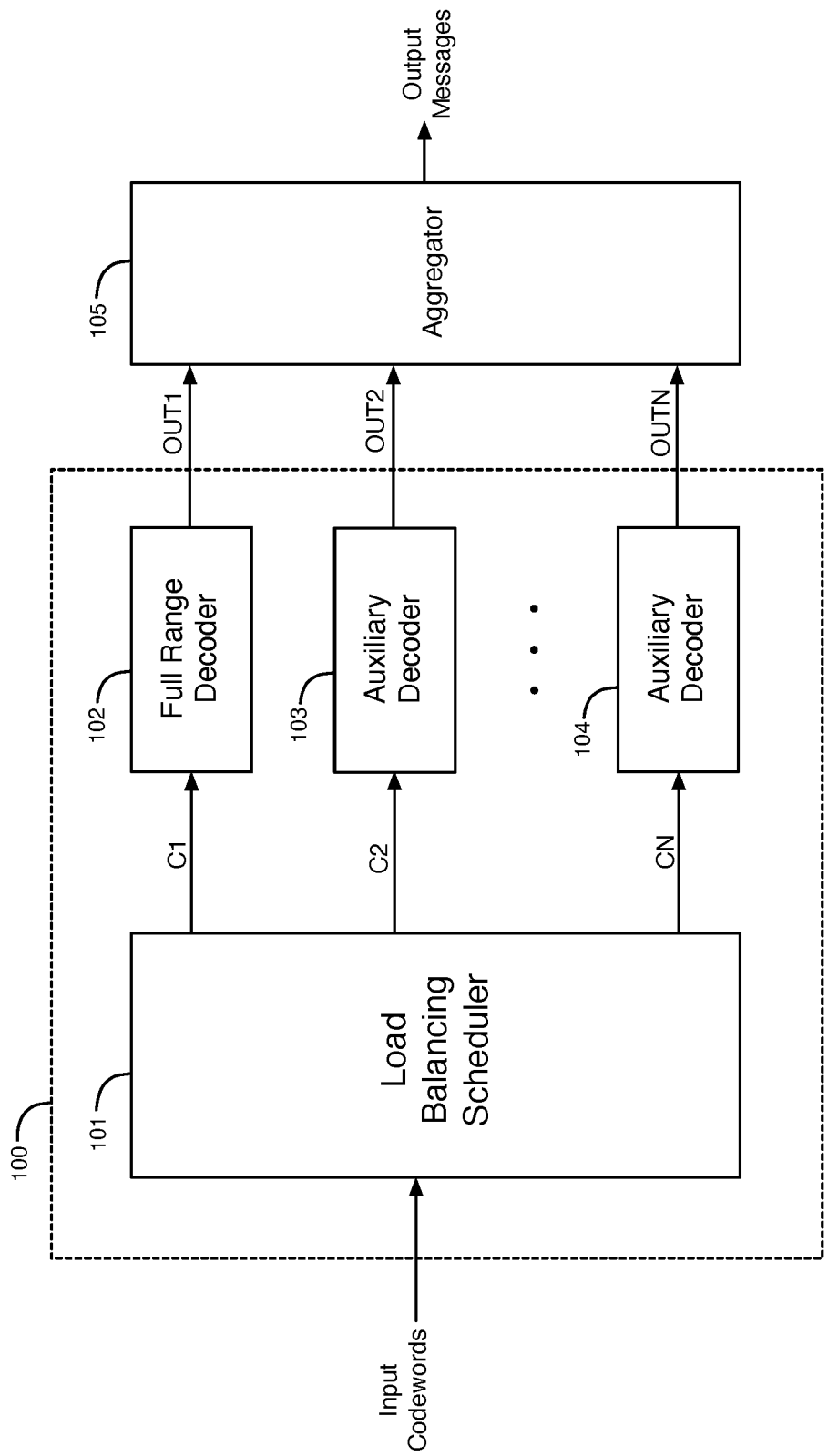
FIG. 1 illustrates an example of a decoding circuit system that decodes codewords using a full range decoder and one or more auxiliary decoders that increase the throughput efficiency of the decoding system.

One or more specific examples are described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

This disclosure discusses load balanced decoder circuit systems that can be implemented on integrated circuit devices, including programmable logic devices such as field-programmable gate arrays (FPGAs). As discussed herein, load balanced decoder circuit systems may use hard logic and soft logic of an FPGA. As used herein, "hard logic" generally refers to circuits in an integrated circuit device (e.g., a programmable logic device) that are not programmable by an end user. The circuits in the integrated circuit device that are programmable by the end user are considered "soft logic." For example, hard logic circuits in an FPGA may include arithmetic units (e.g., digital signal processing (DSP) blocks) that are included in an FPGA and unchangeable by the end user.

A quasi-cyclic (QC) low density parity check (LDPC) decoder that has been compiled according to the 5G NR specification needs to support a full range of lifting factors ($Z_C$). A QC-LDPC code is a structured irregular LDPC code that is composed of a base matrix and a lifting factor $Z_C$. After the base matrix is determined, the lifting factor $Z_C$ is selected based on the size of the encoded data (i.e., codewords) to be generated by the LDPC encoder. Then, the base matrix is modified according to the lifting factor to generate a modified parity check matrix that is used to generate the encoded codewords. A 5G LDPC matrix may be constructed using a $Z_C$-by-$Z_C$ cyclic-shift identity matrix, where $Z_C$ is the lifting factor. Using an example from the 5G standard, the lifting factor may vary from 2 to 384 for codewords.

Multiple LDPC decoders operating in parallel may be provided in a decoding system to increase the data throughput of the decoding system. However, using multiple LDPC decoders in a decoding system dramatically increases the circuit area of the decoding system and increases the difficulty of closing the signal timing for the decoding system. For short codewords generated by an LDPC encoder, the lifting factor has a high likelihood of being less than half of the maximum value of the lifting factor (e.g., 192 for 5G).

According to some examples disclosed herein, a decoding circuit system is provided that decodes input codewords using a full range decoder and one or more auxiliary decoders to improve the decoding efficiency of the decoding circuit system. The codewords may be encoded using an encoding technique such as low density parity check (LDPC) encoding prior to being transmitted through a communication channel (e.g., a wireless channel). Each of the codewords may have a lifting factor that is based on the size of the codeword. The codewords may be transmitted to the decoding circuit system through the communication channel. The communication channel may be built according to a communications standard (such as 5G) that defines a maximum lifting factor for the codewords transmitted through the channel. The decoding circuit system has a load balancing scheduler that directs each of the codewords having a lifting factor that is greater than a predefined value to the full range decoder. The predefined value is less than the maximum lifting factor. The full range decoder decodes the codewords received from the load balancing scheduler that have lifting factors greater than the predefined value. The load balancing scheduler directs each of the codewords having a lifting factor that is less than the predefined value to one or more auxiliary decoders. The auxiliary decoders decode the codewords received from the load balancing scheduler that have less than the predefined value. The auxiliary decoders are smaller than the full range decoder. The decoders may be, for example, LDPC decoders. The decoding circuit system may be used with any communication standard, such as the 5G NR specification.

FIG. 1 illustrates an example of a decoding circuit system 100 that decodes codewords using a full range decoder and one or more auxiliary decoders that increase the throughput efficiency of the decoding circuit system 100. The decoding circuit system 100 includes a load balancing scheduler 101, a full range decoder 102, and one or more auxiliary decoders, such as auxiliary decoders 103-104. The decoding circuit system 100 may be provided in an integrated circuit, such as a programmable logic integrated circuit (IC), a microprocessor IC, a graphics processing unit IC, or an application specific IC. Each of the load balancing scheduler 101 and the decoders 102-104 may be a circuit in the IC.

Input codewords are provided to the load balancing scheduler 101 from a communication channel (such as a 5G NR channel). The codewords may be encoded using an encoding technique such as low density parity check (LDPC) encoding prior to being transmitted through the communication channel. Each of the input codewords has a lifting factor that is based on the size of the input codeword. The load balancing scheduler 101 separates the input codewords based on the lifting factors of the input codewords. Specifically, the load balancing scheduler 101 separates the input codewords having lifting factors greater than a predefined value from the input codewords having lifting factors less than the predefined value. The load balancing scheduler 101 transmits each of the input codewords having a lifting factor greater than the predefined value to the full range decoder 102. The codewords having lifting factors that are greater than the predefined value are indicated in Figure (FIG. 1) by codewords C1. The load balancing scheduler 101 transmits each of the input codewords having a lifting factor less than the predefined value to one or more auxiliary decoders, such as auxiliary decoders 103 and 104. The codewords having lifting factors that are less than the predefined value are indicated in FIG. 1, for example, by codewords C2 and CN.

Figure 2:
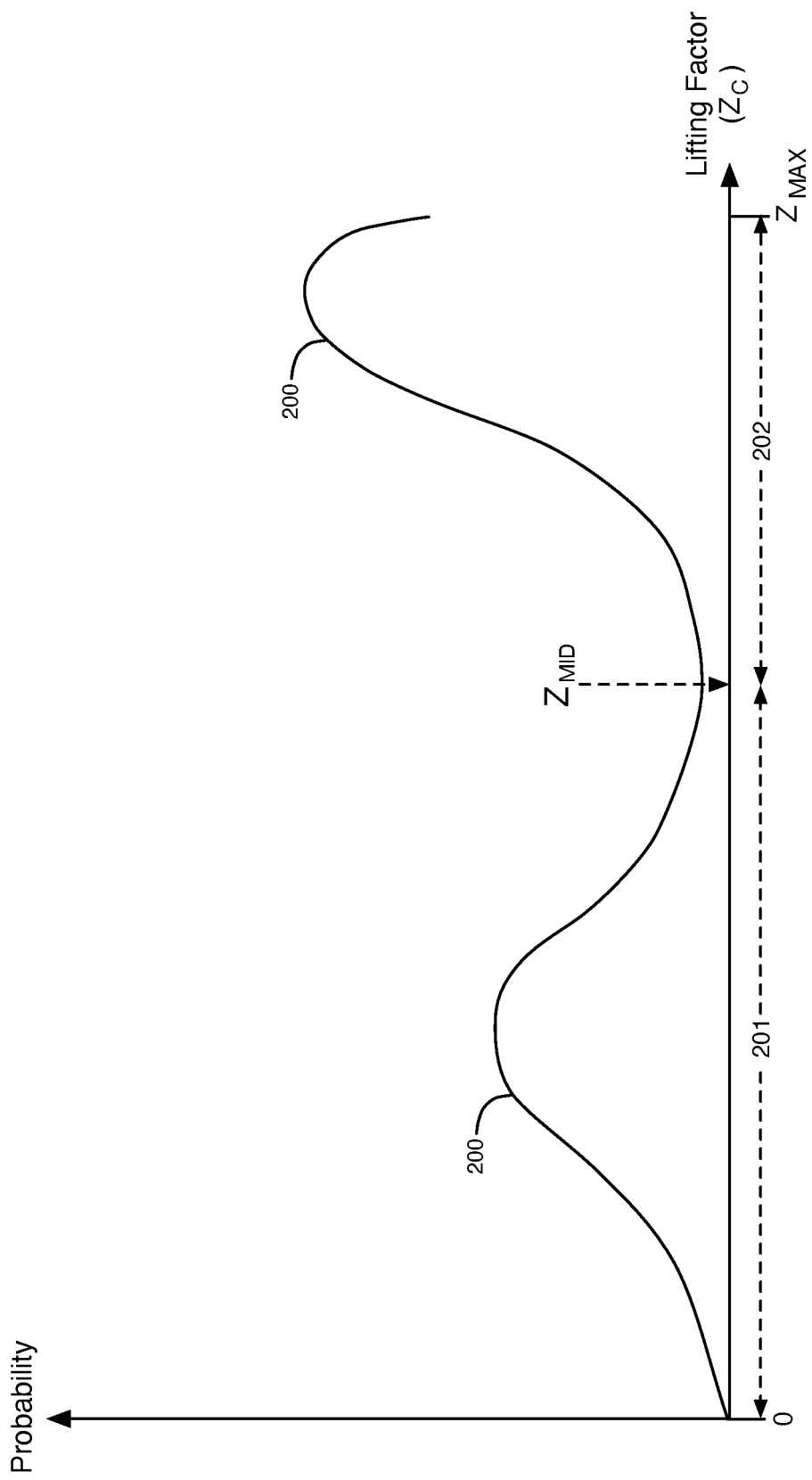
FIG. 2 is a graph that illustrates an example of the probability distribution of the lifting factors ($Z_C$) for input codewords that are transmitted through a communication channel.

The predefined value that the load balancing scheduler 101 uses to determine which of the input codewords to send to the decoders 102-104 may, for example, be selected based on the probability distribution of the lifting factors for the input codewords. FIG. 2 is a graph that illustrates an example of the probability distribution of the lifting factors ($Z_C$) for input codewords that are transmitted through a communication channel, such as a 5G NR channel. FIG. 2 illustrates a curve 200 for a probability distribution of the lifting factors ($Z_C$) for input codewords transmitted through a communication channel having a maximum lifting factor $Z_{MAX}$. The probability distribution shown by the curve 200 of FIG. 2 may, for example, be for codewords that are transmitted through a 5G NR network or any other type of network. The point $Z_{MID}$ in the curve 200 for the lifting factor is the point in the curve 200 at which the area under the curve 200 from 0 to $Z_{MID}$ is equal to the area under the curve 200 from $Z_{MID}$ to $Z_{MAX}$. The range from 0 to $Z_{MID}$ is shown by arrows 201, and the range from $Z_{MID}$ to $Z_{MAX}$ is shown by arrows 202. Curve 200 has two peaks. One of these peaks is less than $Z_{MID}$, and the other one of these peaks is greater than $Z_{MID}$.

In some examples of decoding circuit system 100, the predefined value used by the load balancing scheduler 101 equals $Z_{MID}$. According to these examples, load balancing scheduler 101 transmits each of the input codewords having a lifting factor greater than $Z_{MID}$ to the full range decoder 102. The full range decoder 102 decodes the input codewords having lifting factors greater than the predefined value (e.g., $Z_{MID}$) to generate decoded output data OUT1. The load balancing scheduler 101 transmits each of the input codewords having a lifting factor less than $Z_{MID}$ to one of the auxiliary decoders, such as auxiliary decoders 103 and 104. The auxiliary decoder 103 decodes a first subset of the input codewords C2 having lifting factors less than the predefined value (e.g., $Z_{MID}$) to generate decoded output data OUT2. The auxiliary decoder 104 decodes a second subset of the input codewords CN having lifting factors less than the predefined value (e.g., $Z_{MID}$) to generate decoded output data OUTN. Each of the decoders 102-104 may have an input buffer that stores subsequently received input codewords while the decoder is decoding a current codeword. The decoded output data OUT1, OUT2, and OUTN from the decoders 102-104 are provided to inputs of aggregator circuit 105. Aggregator circuit 105 aggregates together the decoded output data OUT1, OUT2, and OUTN to generate a stream of output messages.

In some implementations, the auxiliary decoders 103-104 use different values of Z. In these implementations, each of the auxiliary decoders 103-104 can use a different Z value. According to a specific example that is not intended to be limiting, the full range decoder 102 decodes codewords up to a Z value of 384, auxiliary decoder 103 decodes codewords up to a Z value of 192, and auxiliary decoder 104 decodes codewords up to a Z value of 96.

The decoders 102-104 may decode the input codewords using any type of error correction technique, such as quasi-cyclic (QC) low density parity check (LDPC) codes. Each of the decoders 102-104 may decode input codewords using a low density parity check matrix (PCM) that is constructed using a $Z_C$-by-$Z_C$ cyclic-shift identity matrix, where $Z_C$ is the lifting factor selected for the respective decoder. Decoding circuit system 100 may have additional auxiliary decoders that decode additional subsets of the input codewords having lifting factors less than the predefined value (e.g., $Z_{MID}$) to generate additional output data. Input codewords that have a lifting factor equal to the predefined value (e.g., $Z_{MID}$) may be transmitted to and decoded by any one or more of the decoders 102-104.

According to some examples of decoding circuit system 100, each of the decoders 102-104 may be implemented with a $Z_C$ number of processing circuits operating in parallel to decode input codewords. In these examples, the hardware resource usage (i.e., the number and size of the processing circuits) scales with the lifting factor $Z_C$, in addition to other hardware overhead. To implement the 5G NR standard, the full range decoder 102 may, for example, be implemented with 384 processing circuits operating in parallel with a lifting factor up to 384 to decode input codewords. Each of the auxiliary decoders 103 and 104 may, for example, be implemented with less than 384 processing circuits operating in parallel with a lifting factor less than 384 to decode input codewords.

Using the probability distribution from curve 200 of FIG. 2, each of the auxiliary decoders 103 and 104 may be implemented with a $Z_{MID}$ number of processing circuits operating in parallel with a lifting factor of $Z_{MID}$ to decode input codewords.

According to another example, each of the auxiliary decoders, such as auxiliary decoders 103-104, may decode input codewords having a different range of lifting factors that are less than the predefined value. As a more specific example, auxiliary decoder 103 may decode input codewords having lifting factors between 0 and $Z_{MID}/2$ to generate output data OUT2, and auxiliary decoder 104 may decode input codewords having lifting factors between $Z_{MID}/2$ and $Z_{MID}$ to generate output data OUTN. In this example, load balancing scheduler 101 sends input codewords having lifting factors between 0 and $Z_{MID}/2$ to decoder 103 and input codewords having lifting factors between $Z_{MID}/2$ and $Z_{MID}$ to decoder 104.

Although the full range decoder 102 is capable of decoding codewords having lifting factors from 0 to $Z_{MAX}$, using multiple full range decoders 102 to increase the throughput of decoding circuit system 100 would use a substantial amount of hardware resources. The auxiliary decoders 103-104 are smaller than the full range decoder 102, because decoders 103-104 are designed to have lifting factors up to $Z_{MID}$. For example, each of the auxiliary decoders 103 and 104 may use a $Z_{MID}$ number (or less) of processing circuits to decode input codewords. As a result, each of the auxiliary decoders 103-104 uses less circuit area in the IC than the full range decoder 102. The full range decoder 102 is able to decode input codewords having lifting factors up to $Z_{MAX}$, but full range decoder 102 is only used in decoding circuit system 100 to decode input codewords having lifting factors that are greater than (or equal to) the predefined value (e.g., $Z_{MID}$). Decoding circuit system 100 uses multiple decoders 102-104 operating in parallel to increase the data throughput of the decoding circuit system 100, while reducing the amount of additional circuit area used by the additional decoders 103-104, because decoders 103-104 each use fewer processing circuits to perform decoding. The formula (1) below defines the throughput efficiency for a decoding system.

$$\text{Decoder throuput efficiency} = \frac{\text{Decoding throughput}}{\text{size of decoder design}} \quad (1)$$

An example is now described that illustrates how the auxiliary decoders 103-104 increase the throughput efficiency of decoding circuit system 100. According to this example, the circuit size for each of the auxiliary decoders 103 and 104 is 60% of the full range decoder 102. Each of the decoders 103-104 may have 60% of the processing circuits that are in full range decoder 102. In an example in which a decoding system has one full range decoder and only one auxiliary decoder operating in parallel, the throughput efficiency of the decoding system is 25% greater than the throughput efficiency of a decoding system having only one full range decoder 102 operating alone without an auxiliary decoder, as shown by the equation (2) below. In equation (2) below, the 1s in the numerator indicate the throughput of the full range decoder and the one auxiliary decoder. Thus, using two decoders in the decoding system doubles the throughput of the decoding system. The 1 and the 0.6 in the denominator indicate the circuit areas of the full range decoder and the auxiliary decoder, respectively.

$$\text{Throughput efficiency improvement} = \frac{1+1}{1+0.6} - 1 = 25\% \quad (2)$$

Figure 3:
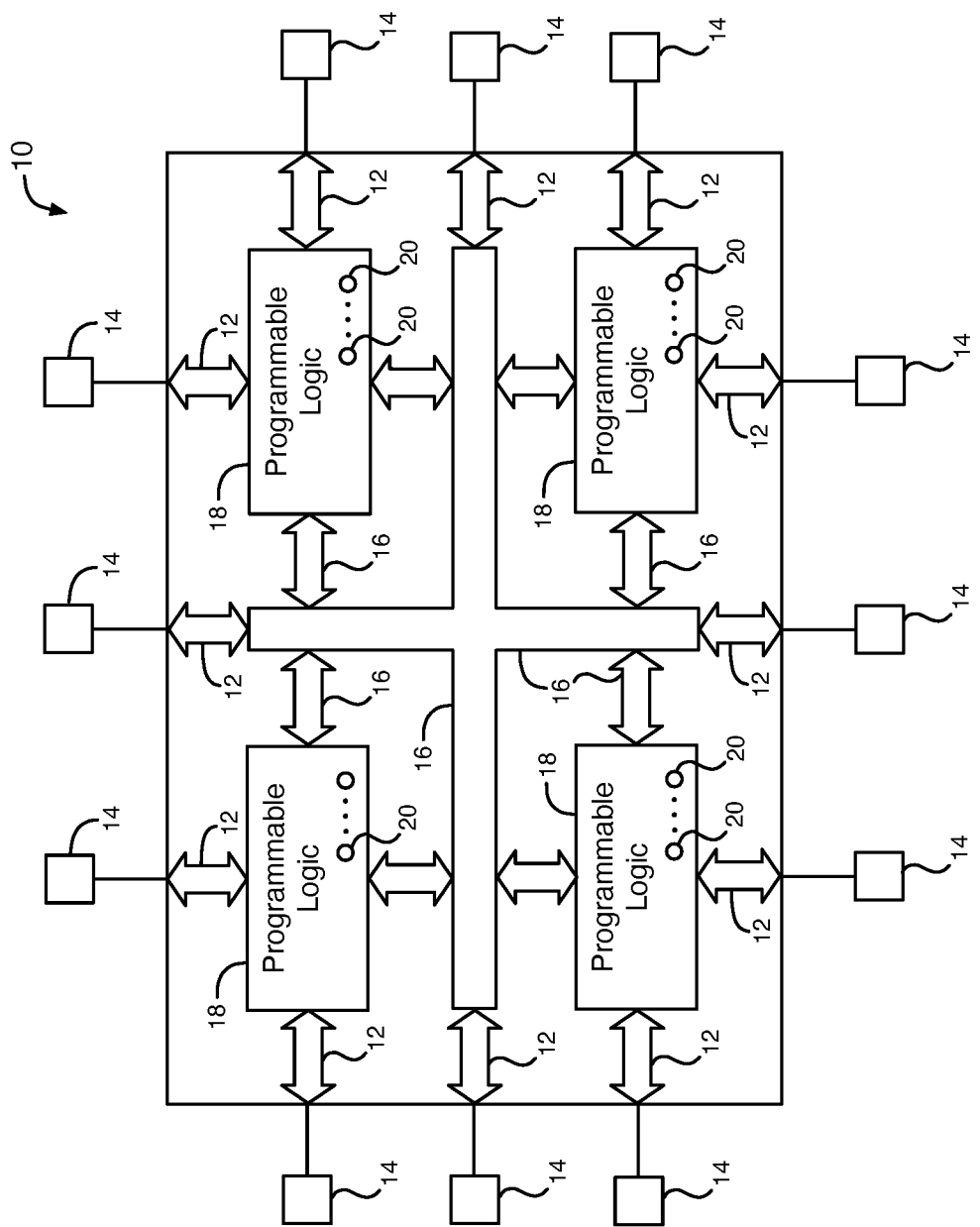
FIG. 3 is a diagram of an illustrative programmable logic integrated circuit (IC) that may include a decoding system as shown in FIG. 1.

An illustrative programmable logic integrated circuit (IC) 10 that may include a decoding circuit system 100 is shown in FIG. 3. As shown in FIG. 3, programmable logic integrated circuit 10 may have input-output circuitry 12 for driving signals off of IC 10 and for receiving signals from other devices via input-output pads 14. Interconnection resources 16 such as global, regional, and local vertical and horizontal conductive lines and buses may be used to route signals on IC 10. Interconnection resources 16 include fixed interconnects (conductive lines) and programmable interconnects (i.e., programmable connections between respective fixed interconnects). Programmable logic circuitry 18 may include combinational and sequential logic circuitry. The programmable logic circuitry 18 may be configured to perform custom logic functions. One or more portions of the programmable logic circuitry 18 may be configured as a decoding circuit system 100, as disclosed herein with respect to FIG. 1.

Programmable logic IC 10 contains memory elements 20 that can be loaded with configuration data using pads 14 and input-output circuitry 12. Once loaded, the memory elements 20 may each provide a corresponding static control output signal that controls the state of an associated logic component in programmable logic circuitry 18. Typically, the memory element output signals are used to control the gates of metal-oxide-semiconductor (MOS) transistors. In the context of programmable integrated circuits, the memory elements 20 store configuration data and are sometimes referred to as configuration random-access memory (CRAM) cells.

In general, software and data for performing any of the functions disclosed herein may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Additional examples are now described. Example 1 is a decoding circuit system comprising: a load balancing scheduler circuit; a full range decoder circuit, wherein the load balancing scheduler circuit provides codewords that each have a lifting factor greater than a predefined value to the full range decoder circuit, and wherein the full range decoder circuit decodes the codewords that each have a lifting factor greater than the predefined value to generate first decoded output data; and a first auxiliary decoder circuit, wherein the load balancing scheduler circuit provides codewords that each have a lifting factor less than the predefined value to the first auxiliary decoder circuit, and wherein the first auxiliary decoder circuit decodes the codewords that each have a lifting factor less than the predefined value to generate second decoded output data.

In Example 2, the decoding circuit system of Example 1 may optionally include, wherein the predefined value equals a point in a curve for a probability distribution of the lifting factors of the codewords at which an area under the curve up to the predefined value is equal to an area under the curve from the predefined value up to a maximum value of the curve.

In Example 3, the decoding circuit system of any one of Examples 1-2 may further comprise: a second auxiliary decoder circuit, wherein the load balancing scheduler circuit provides additional codewords each having a lifting factor less than an additional predefined value to the second auxiliary decoder circuit, wherein the additional predefined value is less than the predefined value, and wherein the second auxiliary decoder circuit decodes the additional codewords to generate third decoded output data.

In Example 4, the decoding circuit system of any one of Examples 1-2 may optionally include, wherein the full range decoder circuit comprises first processing circuits that decode the codewords that each have a lifting factor greater than the predefined value, wherein the first auxiliary decoder circuit comprises second processing circuits that decode the codewords that each have a lifting factor less than the predefined value, and wherein a number of the second processing circuits in the first auxiliary decoder circuit is less than or equal to the predefined value.

In Example 5, the decoding circuit system of Example 4 may optionally further comprise: a second auxiliary decoder circuit, wherein the load balancing scheduler circuit provides additional codewords each having a lifting factor less than the predefined value to the second auxiliary decoder circuit, wherein the second auxiliary decoder circuit comprises third processing circuits that decode the additional codewords to generate third decoded output data, and wherein a number of the third processing circuits in the second auxiliary decoder circuit is less than or equal to the predefined value.

In Example 6, the decoding circuit system of any one of Examples 1-5 may optionally include, wherein the load balancing scheduler circuit provides additional codewords that each have a lifting factor less than the predefined value to the full range decoder circuit, wherein the full range decoder circuit decodes the additional codewords to generate third decoded output data, and wherein the first auxiliary decoder circuit is smaller than the full range decoder circuit.

In Example 7, the decoding circuit system of any one of Examples 1-6 may optionally include, wherein the load balancing scheduler circuit routes additional codewords that each have a lifting factor less than the predefined value to the first auxiliary decoder circuit or to the full range decoder circuit based on an amount of the codewords being processed by the full range decoder circuit and an amount of the codewords being processing by the first auxiliary decoder circuit.

Example 8 is a decoding circuit system comprising: a load balancing scheduler circuit; a full range decoder circuit; and a first auxiliary decoder circuit, wherein the load balancing scheduler circuit provides first codewords having lifting factors greater than lifting factors of second codewords to the full range decoder circuit, wherein the load balancing scheduler circuit provides the second codewords to the first auxiliary decoder circuit, wherein the full range decoder circuit decodes the first codewords to generate first decoded output data, and wherein the first auxiliary decoder circuit decodes the second codewords to generate second decoded output data.

In Example 9, the decoding circuit system of Example 8 may optionally include, wherein the full range decoder circuit comprises first processing circuits that decode the first codewords, wherein a number of the first processing circuits in the full range decoder circuit equals a maximum value of the lifting factors of the first codewords, wherein the first auxiliary decoder circuit comprises second processing circuits that decode the second codewords, and wherein a number of the second processing circuits in the first auxiliary decoder circuit is less than or equal to a maximum value of the lifting factors of the second codewords.

In Example 10, the decoding circuit system of any one of Examples 8-9 may optionally further comprise: an aggregator circuit that aggregates the first decoded output data and the second decoded output data into a stream of messages.

In Example 11, the decoding circuit system of any one of Examples 8-10 may optionally further comprise: a second auxiliary decoder circuit, wherein the load balancing scheduler circuit provides third codewords each having a lifting factor less than the lifting factor of each of the first codewords to the second auxiliary decoder circuit, and wherein the second auxiliary decoder circuit decodes the third codewords to generate third decoded output data.

In Example 12, the decoding circuit system of any one of Examples 8-11 may optionally include, wherein the lifting factor of each of the second codewords is less than a value in a curve for a probability distribution of the lifting factors of the first and the second codewords at which an area under the curve up to the value is equal to an area under the curve from the value up to a maximum value of the curve.

In Example 13, the decoding circuit system of any one of Examples 8-12 may optionally include, wherein the full range decoder circuit decodes the first codewords using a first low density parity check matrix that is generated using a first cyclic-shift identity matrix having a dimension equal to a maximum value of the lifting factors of the first codewords, and wherein the first auxiliary decoder circuit decodes the second codewords using a second low density parity check matrix that is generated using a second cyclic-shift identity matrix having a dimension equal to a maximum value of the lifting factors of the second codewords.

Example 14 is a method for decoding codewords, the method comprising: providing first codewords each having a lifting factor greater than a predefined value from a load balancing scheduler circuit to a full range decoder circuit; providing second codewords each having a lifting factor less than the predefined value from the load balancing scheduler circuit to a first auxiliary decoder circuit; decoding the first codewords with the full range decoder circuit to generate first decoded output data; and decoding the second codewords with the first auxiliary decoder circuit to generate second decoded output data.

In Example 15, the method of Example 14 may optionally further comprise: providing third codewords each having a lifting factor less than the predefined value from the load balancing scheduler circuit to a second auxiliary decoder circuit; and decoding the third codewords with the second auxiliary decoder circuit to generate third decoded output data.

In Example 16, the method of any one of Examples 14-15 may optionally include, wherein decoding the first codewords further comprises decoding the first codewords with first processing circuits in the full range decoder circuit, and wherein a number of the first processing circuits in the full range decoder circuit equals a maximum value of the lifting factors of the first codewords.

In Example 17, the method of Example 16 may optionally include, wherein decoding the second codewords further comprises decoding the second codewords with second processing circuits in the first auxiliary decoder circuit, and wherein a number of the second processing circuits in the first auxiliary decoder circuit is less than or equal to the predefined value.

In Example 18, the method of any one of Examples 14-17 may optionally include, wherein decoding the first codewords further comprises decoding the first codewords using a first low density parity check matrix that is generated using a first cyclic-shift identity matrix having a dimension equal to a lifting factor of the full range decoder circuit, and decoding the second codewords further comprises decoding the second codewords using a second low density parity check matrix that is generated using a second cyclic-shift identity matrix having a dimension equal to a lifting factor of the first auxiliary decoder circuit.

In Example 19, the method of any one of Examples 14-18 may optionally include, wherein the predefined value equals a point in a curve for a probability distribution of the lifting factors of the first and the second codewords at which an area under the curve up to the predefined value is equal to an area under the curve from the predefined value up to a maximum value of the curve.

In Example 20, the method of any one of Examples 14-19 may optionally include, wherein the first auxiliary decoder circuit is smaller than the full range decoder circuit.

It will be recognized by one skilled in the art, that the examples disclosed herein may be practiced without some or all of these specific details. In other instances, well-known operations have not been described in detail in order not to obscure the present examples. It should be appreciated that the examples disclosed herein can be implemented in numerous ways, such as a process, an apparatus, a system, a device, or a method on a computer readable medium.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. A decoding circuit system comprising:
   a load balancing scheduler circuit;
   a full range decoder circuit, wherein the load balancing scheduler circuit provides codewords that each have a lifting factor greater than a predefined value to the full range decoder circuit, and wherein the full range decoder circuit decodes the codewords that each have a lifting factor greater than the predefined value to generate first decoded output data; and
   a first auxiliary decoder circuit, wherein the load balancing scheduler circuit provides codewords that each have a lifting factor less than the predefined value to the first auxiliary decoder circuit, and wherein the first auxiliary decoder circuit decodes the codewords that each have a lifting factor less than the predefined value to generate second decoded output data.

2. The decoding circuit system of claim 1, wherein the predefined value equals a point in a curve for a probability distribution of the lifting factors of the codewords at which an area under the curve up to the predefined value is equal to an area under the curve from the predefined value up to a maximum value of the curve.

3. The decoding circuit system of claim 1 further comprising:
   a second auxiliary decoder circuit, wherein the load balancing scheduler circuit provides additional codewords each having a lifting factor less than an additional predefined value to the second auxiliary decoder circuit, wherein the additional predefined value is less than the predefined value, and wherein the second auxiliary decoder circuit decodes the additional codewords to generate third decoded output data.

4. The decoding circuit system of claim 1, wherein the full range decoder circuit comprises first processing circuits that decode the codewords that each have a lifting factor greater than the predefined value, wherein the first auxiliary decoder circuit comprises second processing circuits that decode the codewords that each have a lifting factor less than the predefined value, and wherein a number of the second processing circuits in the first auxiliary decoder circuit is less than or equal to the predefined value.

5. The decoding circuit system of claim 4 further comprising:
   a second auxiliary decoder circuit, wherein the load balancing scheduler circuit provides additional codewords each having a lifting factor less than the predefined value to the second auxiliary decoder circuit, wherein the second auxiliary decoder circuit comprises third processing circuits that decode the additional codewords to generate third decoded output data, and wherein a number of the third processing circuits in the second auxiliary decoder circuit is less than or equal to the predefined value.

6. The decoding circuit system of claim 1, wherein the load balancing scheduler circuit provides additional codewords that each have a lifting factor less than the predefined value to the full range decoder circuit, wherein the full range decoder circuit decodes the additional codewords to generate third decoded output data, and wherein the first auxiliary decoder circuit is smaller than the full range decoder circuit.

7. The decoding circuit system of claim 1, wherein the load balancing scheduler circuit routes additional codewords that each have a lifting factor less than the predefined value to the first auxiliary decoder circuit or to the full range decoder circuit based on an amount of the codewords being processed by the full range decoder circuit and an amount of the codewords being processing by the first auxiliary decoder circuit.

8. A decoding circuit system comprising:
   a load balancing scheduler circuit;
   a full range decoder circuit; and
   a first auxiliary decoder circuit, wherein the load balancing scheduler circuit provides first codewords having lifting factors greater than lifting factors of second codewords to the full range decoder circuit, wherein the load balancing scheduler circuit provides the second codewords to the first auxiliary decoder circuit, wherein the full range decoder circuit decodes the first codewords to generate first decoded output data, and wherein the first auxiliary decoder circuit decodes the second codewords to generate second decoded output data.

9. The decoding circuit system of claim 8, wherein the full range decoder circuit comprises first processing circuits that decode the first codewords, wherein a number of the first processing circuits in the full range decoder circuit equals a maximum value of the lifting factors of the first codewords, wherein the first auxiliary decoder circuit comprises second processing circuits that decode the second codewords, and wherein a number of the second processing circuits in the first auxiliary decoder circuit is less than or equal to a maximum value of the lifting factors of the second codewords.

10. The decoding circuit system of claim 8 further comprising:
    an aggregator circuit that aggregates the first decoded output data and the second decoded output data into a stream of messages.

11. The decoding circuit system of claim 8 further comprising:
    a second auxiliary decoder circuit, wherein the load balancing scheduler circuit provides third codewords each having a lifting factor less than the lifting factor of each of the first codewords to the second auxiliary decoder circuit, and wherein the second auxiliary decoder circuit decodes the third codewords to generate third decoded output data.

12. The decoding circuit system of claim 8, wherein the lifting factor of each of the second codewords is less than a value in a curve for a probability distribution of the lifting factors of the first and the second codewords at which an area under the curve up to the value is equal to an area under the curve from the value up to a maximum value of the curve.

13. The decoding circuit system of claim 8, wherein the full range decoder circuit decodes the first codewords using a first low density parity check matrix that is generated using a first cyclic-shift identity matrix having a dimension equal to a maximum value of the lifting factors of the first codewords, and wherein the first auxiliary decoder circuit decodes the second codewords using a second low density parity check matrix that is generated using a second cyclic-shift identity matrix having a dimension equal to a maximum value of the lifting factors of the second codewords.

14. A method for decoding codewords, the method comprising:
providing first codewords each having a lifting factor greater than a predefined value from a load balancing scheduler circuit to a full range decoder circuit;
providing second codewords each having a lifting factor less than the predefined value from the load balancing scheduler circuit to a first auxiliary decoder circuit;
decoding the first codewords with the full range decoder circuit to generate first decoded output data; and
decoding the second codewords with the first auxiliary decoder circuit to generate second decoded output data.

15. The method of claim 14 further comprising:
providing third codewords each having a lifting factor less than the predefined value from the load balancing scheduler circuit to a second auxiliary decoder circuit; and
decoding the third codewords with the second auxiliary decoder circuit to generate third decoded output data.

16. The method of claim 14, wherein decoding the first codewords further comprises decoding the first codewords with first processing circuits in the full range decoder circuit, and wherein a number of the first processing circuits in the full range decoder circuit equals a maximum value of the lifting factors of the first codewords.

17. The method of claim 16, wherein decoding the second codewords further comprises decoding the second codewords with second processing circuits in the first auxiliary decoder circuit, and wherein a number of the second processing circuits in the first auxiliary decoder circuit is less than or equal to the predefined value.

18. The method of claim 14, wherein decoding the first codewords further comprises decoding the first codewords using a first low density parity check matrix that is generated using a first cyclic-shift identity matrix having a dimension equal to a lifting factor of the full range decoder circuit, and
decoding the second codewords further comprises decoding the second codewords using a second low density parity check matrix that is generated using a second cyclic-shift identity matrix having a dimension equal to a lifting factor of the first auxiliary decoder circuit.

19. The method of claim 14, wherein the predefined value equals a point in a curve for a probability distribution of the lifting factors of the first and the second codewords at which an area under the curve up to the predefined value is equal to an area under the curve from the predefined value up to a maximum value of the curve.

20. The method of claim 14, wherein the first auxiliary decoder circuit is smaller than the full range decoder circuit.

* * * * *